United States Patent
Hirano et al.

(10) Patent No.: US 8,698,313 B2
(45) Date of Patent: *Apr. 15, 2014

(54) NONVOLATILE SEMICONDUCTOR MEMORY APPARATUS

(75) Inventors: Izumi Hirano, Fujisawa (JP); Shosuke Fujii, Yokohama (JP); Yuichiro Mitani, Kanagawa-ken (JP); Naoki Yasuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/457,054

(22) Filed: Apr. 26, 2012

(65) Prior Publication Data

US 2012/0261742 A1 Oct. 18, 2012

Related U.S. Application Data

(63) Continuation of application No. PCT/JP2009/068845, filed on Nov. 4, 2009.

(51) Int. Cl.
*H01L 23/48* (2006.01)
*H01L 23/52* (2006.01)
*H01L 29/40* (2006.01)

(52) U.S. Cl.
USPC ........... 257/761; 257/324; 257/310; 438/648; 438/656; 438/683; 438/685; 438/216; 438/261; 438/591; 438/593

(58) Field of Classification Search
USPC ......... 438/287, 288, 648, 656, 683, 685, 216, 438/261, 591, 593; 257/324, 761, E29.309, 257/310
See application file for complete search history.

(56) References Cited

U.S. PATENT DOCUMENTS 7,504,700 B2 * 3/2009 Zhu et al. .................. 257/410
7,943,984 B2 * 5/2011 Koike et al. ................. 257/325

(Continued)

FOREIGN PATENT DOCUMENTS

| JP | 2004-103902 | 4/2004 |
| JP | 2006-324351 | * 11/2006 |

(Continued)

OTHER PUBLICATIONS

Colombo et al., "Gate Dielectric Process Technology for the Sub-1 nm Equivalent Oxide Thickness (EOT) Era", pp. 51-55 (2007).*

(Continued)

*Primary Examiner* — Jarrett Stark
*Assistant Examiner* — Mohammad M Hoque
(74) *Attorney, Agent, or Firm* — Finnegan, Henderson, Farabow, Garrett & Dunner, L.L.P.

(57) ABSTRACT

A nonvolatile semiconductor memory apparatus according to an embodiment includes: a semiconductor layer; a first insulating film formed on the semiconductor layer, the first insulating film being a single-layer film containing silicon oxide or silicon oxynitride; a charge trapping film formed on the first insulating film; a second insulating film formed on the charge trapping film; and a control gate electrode formed on the second insulating film. A metal oxide exists in an interface between the first insulating film and the charge trapping film, the metal oxide comprises material which is selected from the group of $Al_2O_3$, $HfO_2$, $ZrO_2$, $TiO_2$, and MgO, the material is stoichiometric composition, and the charge trapping film includes material different from the material of the metal oxide.

12 Claims, 12 Drawing Sheets

(56) References Cited

U.S. PATENT DOCUMENTS

| | | | |
|---|---|---|---|
| 8,211,811 B2* | 7/2012 | Matsushita et al. | 438/763 |
| 2009/0078983 A1 | 3/2009 | Nakasaki et al. | |
| 2009/0242956 A1* | 10/2009 | Heng et al. | 257/316 |
| 2009/0267134 A1 | 10/2009 | Koike et al. | |
| 2010/0052035 A1 | 3/2010 | Koike et al. | |
| 2010/0072535 A1 | 3/2010 | Takashima et al. | |
| 2010/0276747 A1* | 11/2010 | Lee et al. | 257/325 |

FOREIGN PATENT DOCUMENTS

| | | | |
|---|---|---|---|
| JP | 2007-266143 | | 10/2007 |
| JP | 2008-171968 | | 7/2008 |
| JP | 2009-81203 | | 4/2009 |
| JP | 2009-212321 | * | 9/2009 |
| JP | 2009-231373 | | 10/2009 |
| KR | 10-0858758 | | 9/2008 |
| KR | 10-2009-0032010 | | 3/2009 |

OTHER PUBLICATIONS

Notification of Reason for Rejection issued by the Japanese Patent Office on Aug. 6, 2013, for Japanese Patent Application No. 2011-539219, and English-language translation thereof.

Notice of Preliminary Rejection, issued by Korean Intellectual Property Office, mailed Jun. 27, 2013, in Korean patent application No. 10-2013-7010700 (9 pages including English translation).

International Preliminary Report on Patentability and Written Opinion issued by the International Bureau of WIPO on Jun. 12, 2012, for International Patent Application No. PCT/JP2009/068845.

Notice of Preliminary Rejection, issued by Korean Intellectual Property Office, mailed Jun. 27, 2013, in Korean patent application No. 10-2012-7010700 (9 pages including English translation).

International Search Report from Japanese Patent Office for International Application No. PCT/JP2009/068845, Mailed Feb. 2, 2010.

Lee, C. H. et al., "A Novel SONOS Structure of $SiO_2/SiN/Al_2O_3$ with TaN Metal Gate for Multi-Giga Bit Flash Memories," International Electron Device Meeting Technical Digest, 4 Sheets (2003).

Yamamoto, Y. et al., "$V_{FB}$ Modification by Thin $La_2O_3$ Insertion into $HfO_2/SiO_2$ Interface," IWDTF, pp. 65-66 (2006).

Kamimuta, Y. et al., "Comprehensive Study of $V_{FB}$ Shift in High-k CMOS—Dipole Formation, Fermi-level Pinning and Oxygen Vacancy Effect -," IEDM, pp. 341-344 (2007).

Katsumata, R. et al., "Pipe-shaped BiCS Flash Memory with 16 Stacked Layers and Multi-Level-Cell Operation for Ultra High Density Storage Devices," Symposium on VLSI Technology Digest of Technical Papers, pp. 136-137 (2009).

Fujii, S. et al., "A New Method to Extract the Charge Centroid in the Program Operation of MONOS Memories," SSDM, pp. 158-159 (2009).

Notification of Reason for Rejection issued by the Japanese Patent Office on Jan. 7, 2014, for Japanese Patent Application No. 2011-539219, and English-language translation thereof.

* cited by examiner

NONVOLATILE SEMICONDUCTOR MEMORY APPARATUS

CROSS-REFERENCE TO RELATED APPLICATION

This application is a continuation of and claims the benefit of prior International Application No. PCT/JP 2009/068845 filed on Nov. 4, 2009, the entire contents of which are incorporated herein by reference.

FIELD

Embodiments described herein relate generally to a nonvolatile semiconductor memory apparatus.

BACKGROUND

In recent years, nonvolatile semiconductor memory apparatuses in which writing and erasing can be electrically performed have become more and more sophisticated. Examples of such nonvolatile semiconductor memory apparatuses include EEPROMs (Electrically Erasable Programmable Read Only Memories), and MONOS (Metal Oxide Nitride Oxide Semiconductor) memories with gates having MONOS structures are being considered as major candidates for next-generation flash memories.

A memory cell of a MONOS memory has a stack structure formed with a control gate electrode, a block insulating film, a charge trapping film, a tunnel insulating film, and a substrate in this order from the top. In this structure, writing is performed by applying a high voltage to the gate electrode to inject and store electrons from the substrate into the charge trapping film via the tunnel insulating film. Erasing is performed by applying a reverse bias to the gate electrode to inject holes from the substrate into the charge trapping film via the tunnel insulating film. In this manner, electrons and holes stored in the charge trapping film pair-annihilate. It is considered that use of such a structure will reduce the problems in conventional floating-gate nonvolatile semiconductor memory apparatuses, such as interferences between adjacent cells and corruption of stored data due to defects in the tunnel insulating film.

However, MONOS memories in practical use have the problem of poor reliability. Particularly, degradation of the tunnel insulating film due to write stress and erase stress that are repeatedly applied is a serious problem, as data retention characteristics are degraded by degradation of the tunnel insulating film. Therefore, to use MONOS memories as next-generation nonvolatile memories, it is essential to improve the resistance to rewriting.

DETAILED DESCRIPTION

Figure 1:
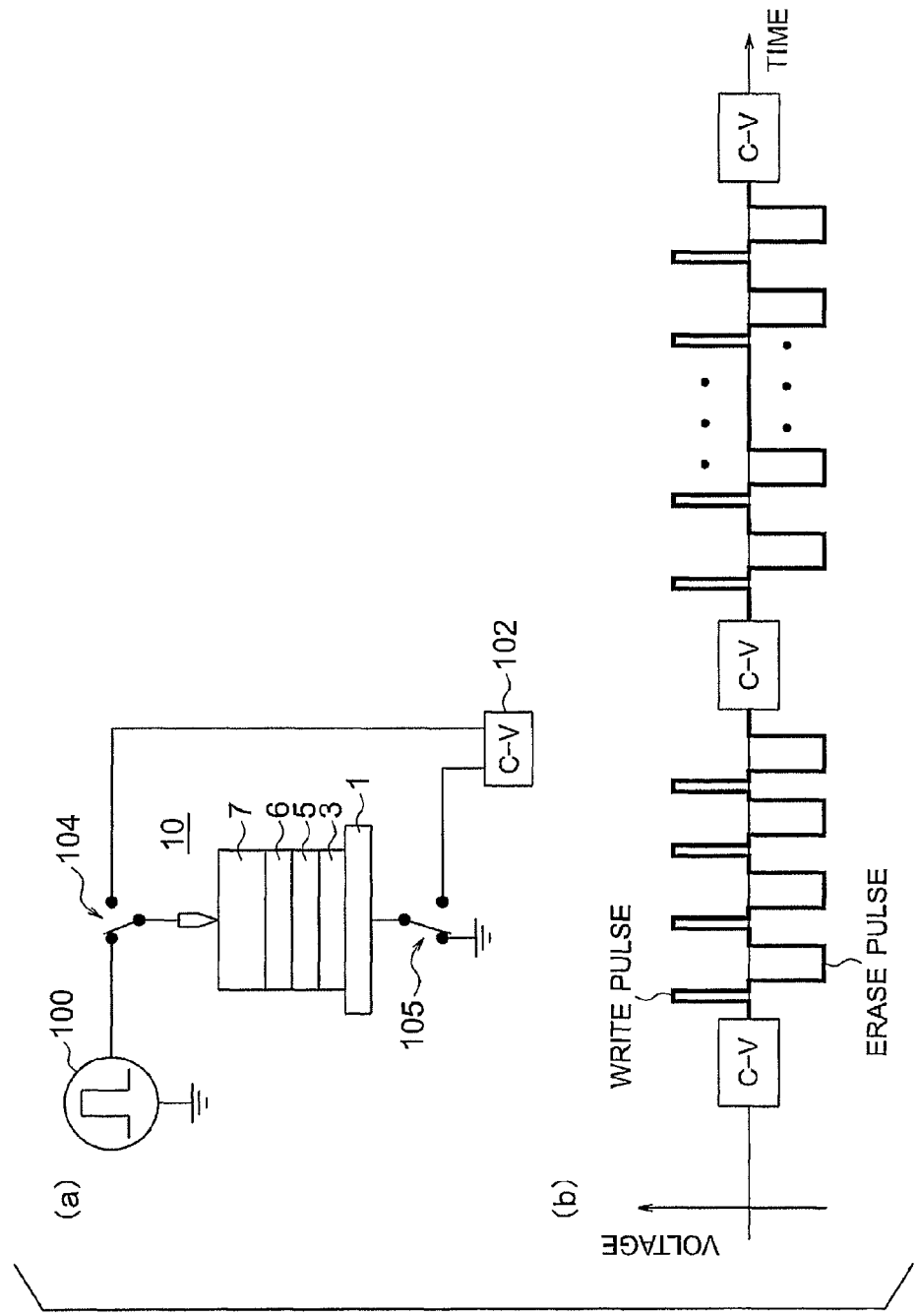
FIG. 1(a) is a schematic view for explaining an experimental equipment.
FIG. 1(b) is a schematic view for explaining write pulse application and erase pulse application, and CV measurement.

A nonvolatile semiconductor memory apparatus according to an embodiment includes: a semiconductor layer; a first insulating film formed on the semiconductor layer, the first insulating film being a single-layer film containing silicon oxide or silicon oxynitride; a charge trapping film formed on the first insulating film; a second insulating film formed on the charge trapping film; and a control gate electrode formed on the second insulating film. A metal oxide exists in an interface between the first insulating film and the charge trapping film, the metal oxide comprises material which is selected from the group consisting of $Al_2O_3$, $HfO_2$, $ZrO_2$, $TiO_2$, and $MgO$, and the material is stoichiometric composition, and the charge trapping film includes material different from the material of the metal oxide.

The following is a detailed description of embodiments, with reference to the accompanying drawings. In the following description, like components are denoted by like reference numerals, and explanation of them will not be made more than once. Each of the drawings is a schematic view, and the shapes, sizes, and proportions of the shown structures might differ from those of actual structures. When an actual device is manufactured, however, the following description and known arts can be taken into consideration.

First, the background to the embodiments and the outlines of the embodiments are described.

The inventors conducted an experiment to measure the injected charge quantity and the amount of CV stretch when writing and erasing were performed on a memory cell of a MONOS memory. FIG. 1(a) shows the experimental equipment. FIG. 1(b) shows the write pulse waveform, the erase pulse waveform, and the time series of the CV measurement. A memory cell 10 having a structure formed by stacking a tunnel insulating film 3, a charge trapping film 5, a block insulating film 6, and a control gate electrode 7 in this order on a semiconductor layer 1 was prepared. It should be noted that, in this specification, a "semiconductor layer" means a well region formed on a semiconductor substrate, a SOI (Silicon On Insulator) layer of a SOI substrate, or a bulk semiconductor substrate.

First, as shown in FIG. 1(b), connections are switched by using a switch 104 and a switch 105, and C-V characteristics in the initial state of the memory cell 10 or in a situation where a write pulse and an erase pulse are not being applied are measured by a C-V measuring device 102. After that, connections are switched by using the switch 104 and the switch 105, to repeatedly apply a set of the write pulse and the erase pulse to the memory cell 10 from a pulse generator. Connections are again switched by using the switch 104 and the switch 105, and C-V characteristics are measured by the C-V measuring device 102. The step of applying the write pulse and the erase pulse, and the step of measuring C-V characteristics are repeatedly carried out. As shown in FIG. 1(b), the "write pulse" means a positive pulse voltage applied to the memory cell 10, and the "erase pulse" means a negative pulse voltage applied to the memory cell 10. Here, the experiment was conducted while the width of the write pulse and the width of the erase pulse were varied between 100 μsec and 100 msec. In FIG. 1(b), "C-V" indicates a situation where C-V characteristics are being measured.

Next, the amount of CV stretch was calculated by using the initial-state C-V characteristics obtained from the above described experiment and the C-V characteristics obtained after repeatedly applying the set of the write pulse and the erase pulse in the above described experiment. The CV stretch amount $C-V_{stretch}$ was calculated according to the following equation:

$$C-V_{stretch} = \Delta V_{cycled} - \Delta V_{initial}$$

Figure 2:
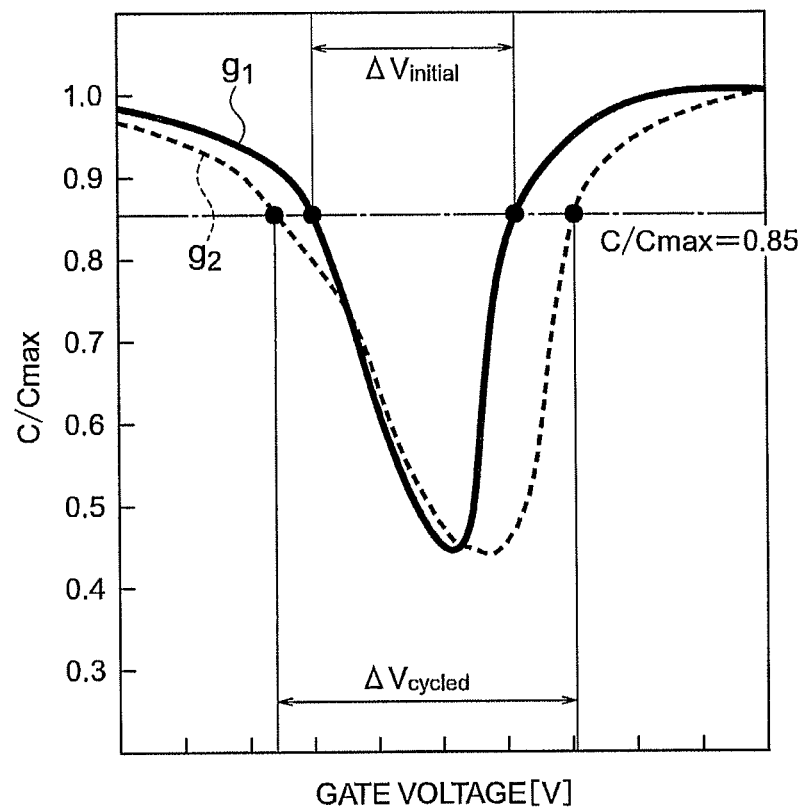
FIG. 2 is a diagram for explaining how a CV stretch amount is estimated.

Here, $\Delta V_{initial}$ is determined from the C-V characteristics in the initial state. FIG. 2 is a graph $g_1$ showing the C-V characteristics in a case where the C-V characteristics at this point was normalized with the maximum capacitance $C_{max}$. The Vfb in a conventional MONOS structure is a voltage that is 80 to 90% of $C_{max}$. Therefore, the difference between the gate voltage at the time of charge storage and the gate voltage at the time of switching (charge emission) when $C/C_{max}$ was 0.85 in the normalized C-V characteristics $g_1$ in the initial state was calculated as $\Delta V_{initial}$ (see the graph $g_1$ in FIG. 2). Also, $\Delta V_{cycled}$ was determined from the C-V characteristics obtained in a case where the write pulse and the erase pulse were repeatedly applied. FIG. 2 is a graph $g_2$ showing the C-V characteristics obtained in a case where the C-V characteristics at this point was normalized with the maximum capacitance $C_{max}$. In the normalized C-V characteristics $g_2$, the difference between the gate voltage at the time of charge storage and the gate voltage at the time of switching when $C/C_{max}$ was 0.85 was calculated as $\Delta V_{cycled}$ (see the graph $g_2$ of FIG. 2). Accordingly, the CV stretch amount $C-V_{stretch}$ represents the interfacial level increase in the tunnel insulating film or degradation of the tunnel insulating film.

Figure 3:
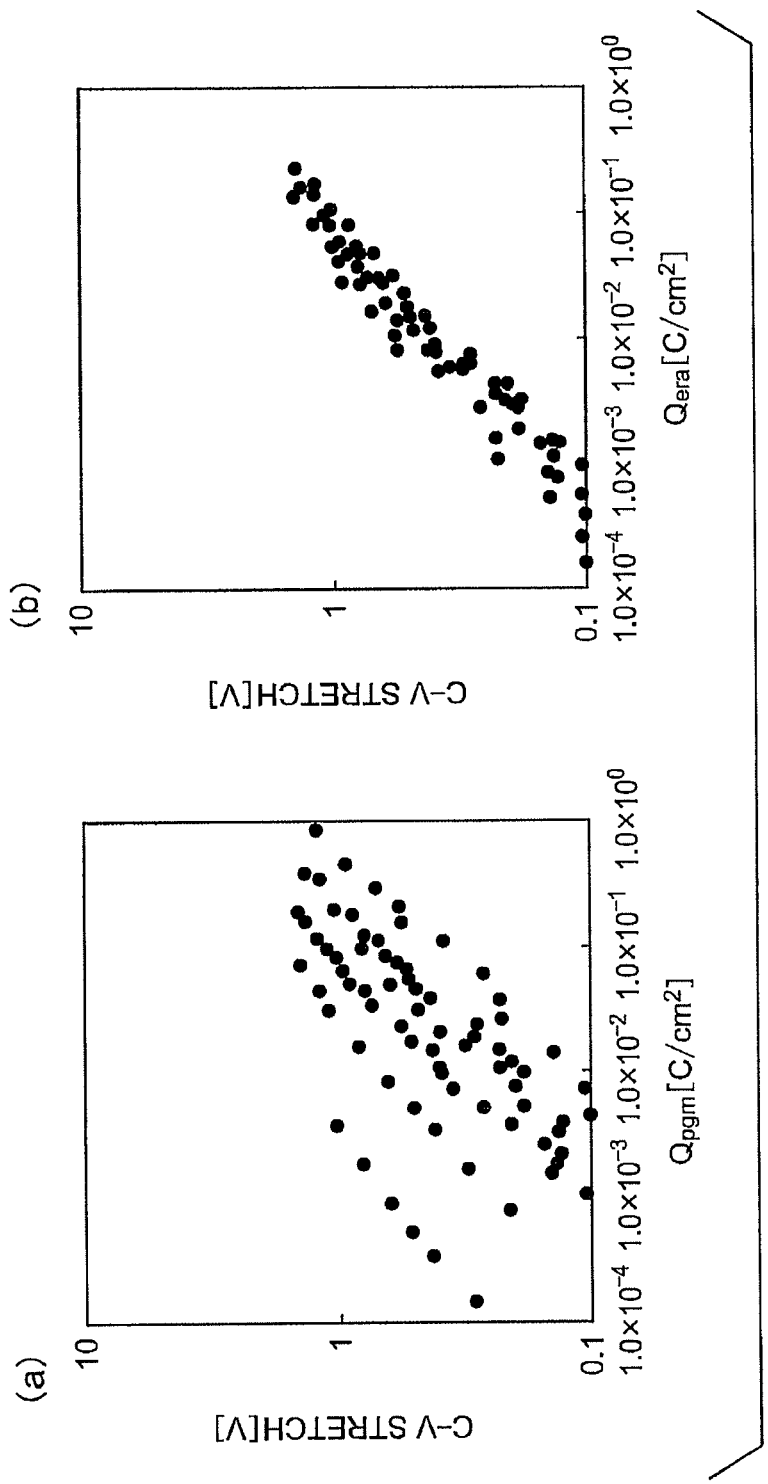
FIGS. 3(a) and 3(b) are graphs showing the correlations between the injected charge quantity and the CV stretch amount at the time of writing and at the time of erasing.
Figure 4:
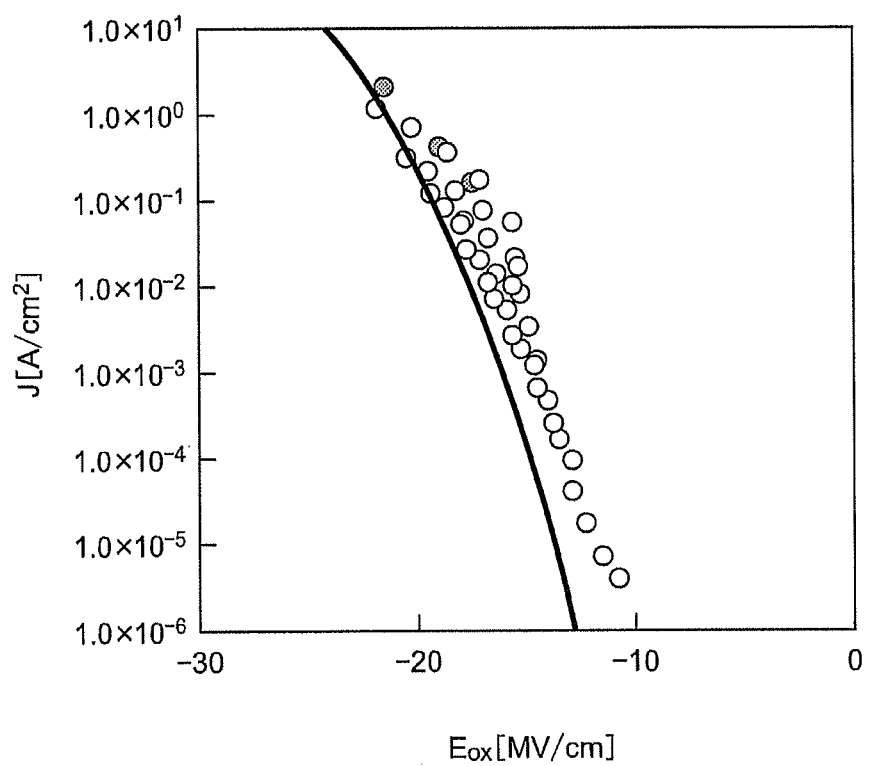
FIG. 4 is a graph showing the electric field dependence of current at the time of erasing.

FIG. 3(a) shows the relationship between the CV stretch amount $C-V_{stretch}$ obtained in the above manner and the cumulative quantity $Q_{pgm}$ of the write pulse applied to the charge trapping film to obtain the CV stretch amount $C-V_{stretch}$. FIG. 3(b) shows the relationship between the CV stretch amount $C-V_{stretch}$ and the cumulative quantity $Q_{era}$ of the erase pulse applied to the charge trapping film to obtain the CV stretch amount $C-V_{stretch}$. In each of FIGS. 3(a) and 3(b), the ordinate axis indicates the CV stretch amount $C-V_{stretch}$. The abscissa axis in FIG. 3(a) indicates $Q_{pgm}$, and the abscissa axis in FIG. 3(b) indicates $Q_{era}$. FIG. 4 shows the electric field dependence of the current at the time of erasing. White circles indicate the current values obtained through the experiment, and the solid line indicates the result of a calculation performed according to the later described equations (2) through (8) on the assumption that the current is holes injected from the substrate. Since the experimental values are almost the same as the calculated values, it is considered that erasing is substantially performed through hole injection. Accordingly, the cumulative quantity $Q_{pgm}$ shown in FIG. 3(a) substantially indicates the cumulative quantity of electrons, and the cumulative quantity $Q_{era}$ shown in FIG. 3(b) substantially indicates the cumulative quantity of holes. As can be seen from FIG. 3(a), the CV stretch amount does not correlate with the cumulative quantity $Q_{pgm}$. As can be seen from FIG. 3(b), however, the CV stretch amount correlates with the cumulative quantity $Q_{era}$. From those results, it is considered that degradation of the tunnel insulating film is determined by the amount of holes injected into the charge trapping film.

Figure 5:
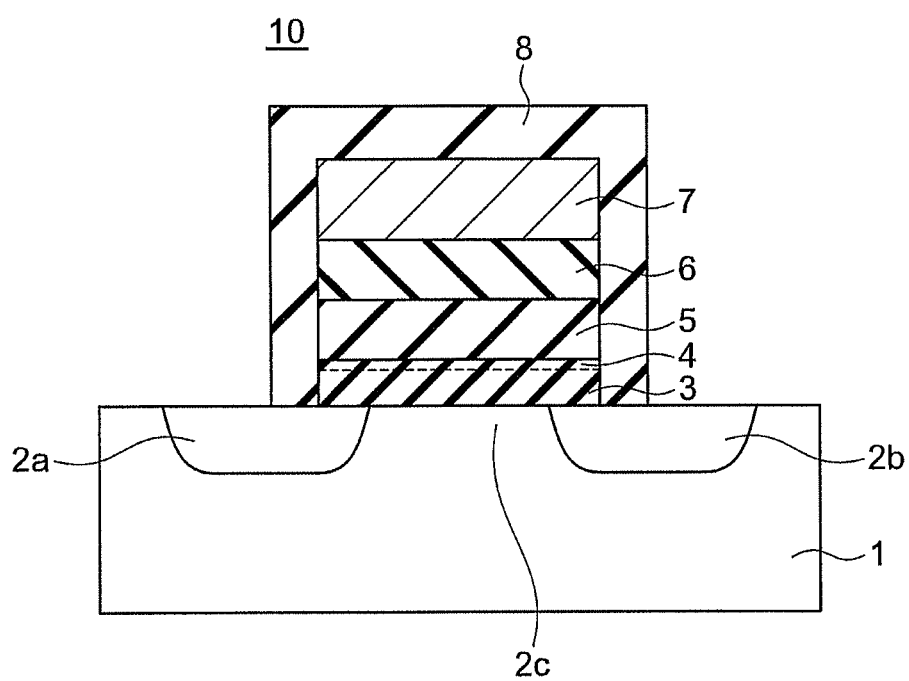
FIG. 5 is a cross-sectional view of a memory cell of a nonvolatile semiconductor memory apparatus according to a first embodiment.

In view of the above, the inventors considered that, to restrain degradation of the tunnel insulating film due to write stress and erase stress, or to increase the resistance to rewriting (endurance properties), it is necessary to provide a region or film that restrains hole injection into the charge trapping film at the time of erasing and performs erasing by emitting electrons from the charge trapping film. That is, an embodiment provides a nonvolatile semiconductor memory apparatus that includes at least one memory cell 10 that is shown in FIG. 5, for example. The memory cell 10 according to this embodiment includes: a source region 2a and a drain region 2b formed at a distance from each other in a semiconductor layer 1; a tunnel insulating film 3 that is formed on the portion of the semiconductor layer 1 to be a channel 2c located between the source region 2a and the drain region 2b, and contains oxygen; a charge trapping film 5 formed on the tunnel insulating film 3; a block insulating film 6 formed on the charge trapping film 5; and a control gate electrode 7 formed on the block insulating film 6. Metal atoms are contained in a region (an interfacial region) 4 in the interface between the tunnel insulating film 3 and the charge trapping film 5, with the region being located on the side of the tunnel insulating film 3. The metal atoms bind to the oxygen in the tunnel insulating film 3. As will be described later, the interfacial region 4 is very thin, but, in the following description, will be also referred to as a metal oxide film 4, for the sake of convenience. That is, the metal oxide film 4 is part of the tunnel insulating film 3. The block insulating film 6 blocks charges from entering the control gate electrode 7 from the charge trapping film 5. In the memory cell 10 according to this embodiment, the upper face of the control gate electrode 7 and the respective side faces of the control gate electrode 7, the block insulating film 6, the charge trapping film 5, the metal oxide film 4, and the tunnel insulating film 3 are covered with a spacer film 8 made of an insulator (such as a silicon oxide film).

Figure 6:
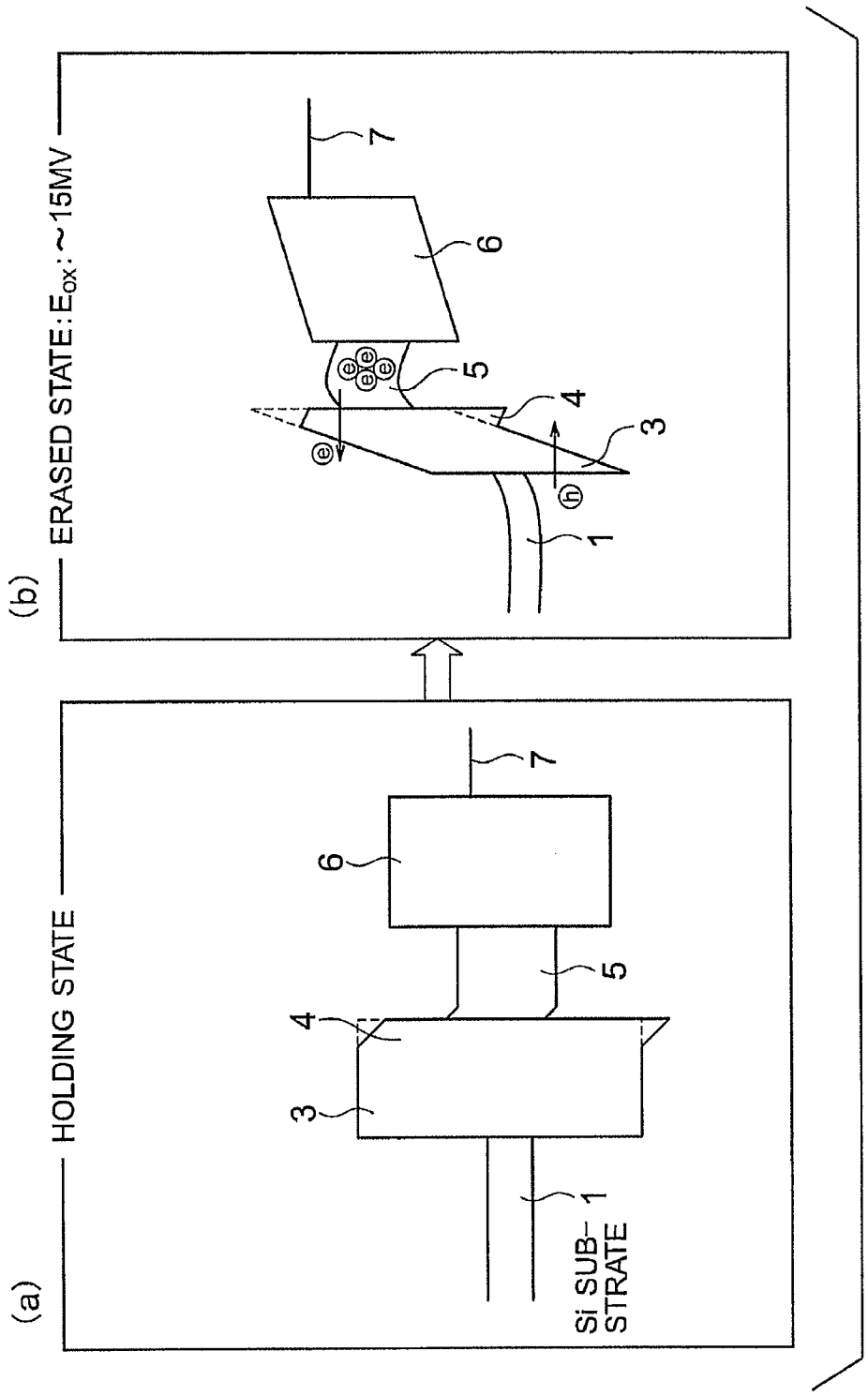
FIGS. 6(a) and 6(b) are diagrams showing the energy bands in a charge holding state and in an erased state, respectively, in the nonvolatile semiconductor memory apparatus according to the first embodiment.

As the metal oxide film 4 is provided between the tunnel insulating film 3 and the charge trapping film 5 as described above, dipoles are generated in the interface between the tunnel insulating film 3 and the metal oxide film 4. FIGS. 6(a) and 6(b) show energy band diagrams of a charge holding state and an erased state in the memory cell 10 according to this embodiment. As dipoles are generated in the interface between the tunnel insulating film 3 and the metal oxide film 4, the barrier of the conduction band of the tunnel insulating film 3 in the interface with the charge trapping film 5 is modulated, and the barrier against electrons becomes lower (FIGS. 6(a) and 6(b)). In FIGS. 6(a) and 6(b), the dashed lines indicate the barrier of the conduction band of the gate insulating film 3 in cases where dipoles are not generated. Therefore, at the time of erasing, the barrier against electrons becomes lower in cases where dipoles are generated (where the metal oxide film 4 is provided) than that in cases where dipoles are not generated (where the metal oxide film 4 is not provided), as shown in FIG. 6(b). Accordingly, electrons are more easily emitted from the charge trapping film 5 to the semiconductor layer 1 via the metal oxide film 4 and the tunnel insulating film 3 in cases where dipoles are generated. As a result, erasing by electron emission is accelerated, and degradation of the tunnel insulating film 3 can be restrained. It should be noted that, in FIG. 6(b), the upper arrow indicates electrons being emitted from the charge trapping film 5, and the lower arrow indicates holes being injected into the charge trapping film 5. Embodiments of nonvolatile semiconductor memory apparatuses each having the above described structure are described in the following.

(First Embodiment)

Figure 7:
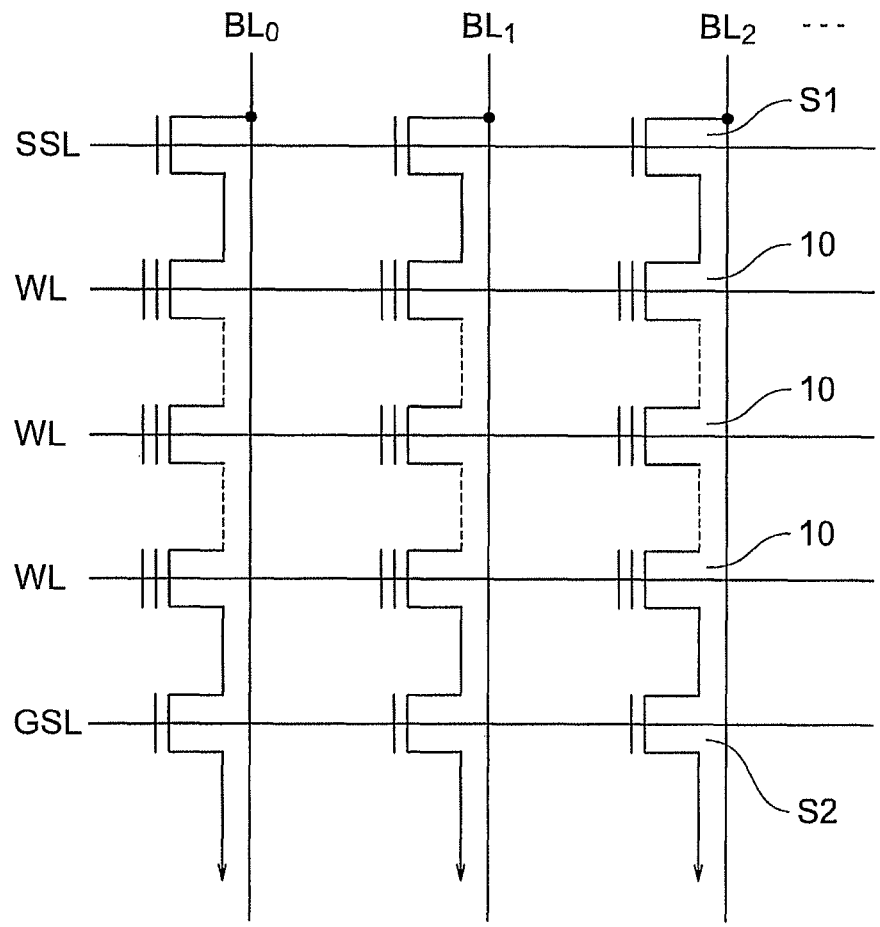
FIG. 7 is a circuit diagram of a NAND nonvolatile semiconductor memory apparatus.

A nonvolatile semiconductor memory apparatus according to a first embodiment is a NAND nonvolatile semiconductor memory apparatus, and includes memory cells 10, as shown in FIG. 7. Those memory cells 10 are connected in series and form NAND strings, with each two adjacent memory cells 10 sharing a source and a drain. Those NAND strings are arranged in a matrix fashion, to form a memory cell array.

The drain at one end of each of the NAND strings arranged in the column direction of the memory cell array is connected to a bit line BL via a select transistor S1, and the source at the other end is also connected to a common source line (not shown) via a select transistor S2. The control gates of the memory cells 10 arranged in the transverse direction in FIG. 7 are collectively connected to word lines WL. The gates of the select transistors S1 and S2 are also collectively connected to select gate lines SSL and GSL. Each region of the NAND strings that are driven through a single word line forms a NAND string block. Normally, such NAND string blocks are arranged in the bit-line direction, to form a memory cell array.

Each of the memory cells 10 is the same as the MONOS memory cell shown in FIG. 5. That is, each memory cell 10 includes an n-type source region 2a and an n-type drain region 2b that are formed at a distance from each other in a p-type Si layer 1, and contain an n-type impurity (P or As, for example). A tunnel insulating film 3 containing a silicon oxide film or a silicon oxynitride film is formed on the portion of the Si layer 1 that is located between the source region 2a and the drain region 2b, and is to be a channel 2c. A metal oxide film 4 is formed on the tunnel insulating film 3. As described above, the metal oxide film 4 is an interfacial region of the interface between the tunnel insulating film 3 and a charge trapping film 5, with the interfacial region being located on the side of the tunnel insulating film 3. The interfacial region 4 contains metal atoms, and the metal atoms bind to the oxygen in the tunnel insulating film 3. That is, the metal oxide film 4 is part of the tunnel insulating film 3. The charge trapping film 5 is formed on the metal oxide film 4, and a block insulating film 6 is formed on the charge trapping film 5. A control gate electrode 7 is formed on the block insulating film 6. The gate having the stack structure formed with the control gate electrode 7, the block insulating film 6, the charge storage film 5, the metal oxide film 4, and the tunnel insulating film 3 is covered with a silicon oxide film 8. Here, the metal oxide film 4 is made of a material forming dipoles in the direction from the charge trapping film 5 to the tunnel insulating film 3, or a material that has positive charges on the side of the charge trapping film 5 and has negative charges on the side of the tunnel insulating film 3, such as a material selected from the group consisting of $Al_2O_3$, $HfO_2$, $ZrO_2$, $TiO_2$, and $MgO$. In other words, the metal oxide film 4 contains at least Al, Hf, Zr, Ti, or Mg.

The tunnel insulating film 3 can be a single-layer film containing silicon oxide or silicon oxynitride. In such a case, the metal oxide film 4 is an interfacial region of the tunnel insulating film 3. Therefore, atoms of a metal selected from the group consisting of Al, Hf, Zr, Ti, and Mg are contained in the interfacial region of the tunnel insulating film 3, and bind to the oxygen in the tunnel insulating film 3. Also, in a case where the tunnel insulating film 3 is a single-layer film containing silicon oxynitride, the nitrogen concentration distribution can extend in the film thickness direction, and a region not containing nitrogen can exist in the interface with the Si layer 1 or in the interface with the charge trapping film 5. It is known that resistance to degradation is increased by adding nitrogen to the silicon oxide film. However, there is a report that dipoles to be generated by the metal oxide film are reduced where nitrogen is added to the silicon oxide film (Y. Yamamoto, et al., IWDTF2006, p. 65). Therefore, the nitrogen concentration [N] is preferably less than 20 atomic %, so that the degradation resistance of the tunnel insulating film 3 can be secured, and dipoles can be generated.

The film thickness of the tunnel insulating film 3 is preferably small, so as to reduce the write voltage. If the film thickness is too small, however, there is an increase in leakage current, and the charge retention characteristics are degraded. Normally, transitional layers of approximately 0.6 nm are formed between a $SiO_2$ film and a Si substrate (a Si layer) and between the $SiO_2$ film and another oxide film. However, such transitional layers have poor film quality. Therefore, the tunnel insulating film 3 preferably has a film thickness of 1.8 nm or greater, with 0.6 nm being added to the thicknesses of the upper and lower $SiO_2$ transitional layers. Where the threshold voltage shift amount $\Delta V_{th}$ in the memory cell 10 is 7 V, for example, the quantity of charges $Q_{trap}$ to be trapped in the charge trapping film 5 during a writing/erasing operation is expressed by using the electrical distance z from the Si substrate 1 to the charge center position and the EOT (Equivalent Oxide Thickness) of the MONOS structure:

$$Q_{trap} = \frac{\varepsilon_{ox} \Delta V_{th}}{(EOT - z)} \quad (1)$$

Figure 8:
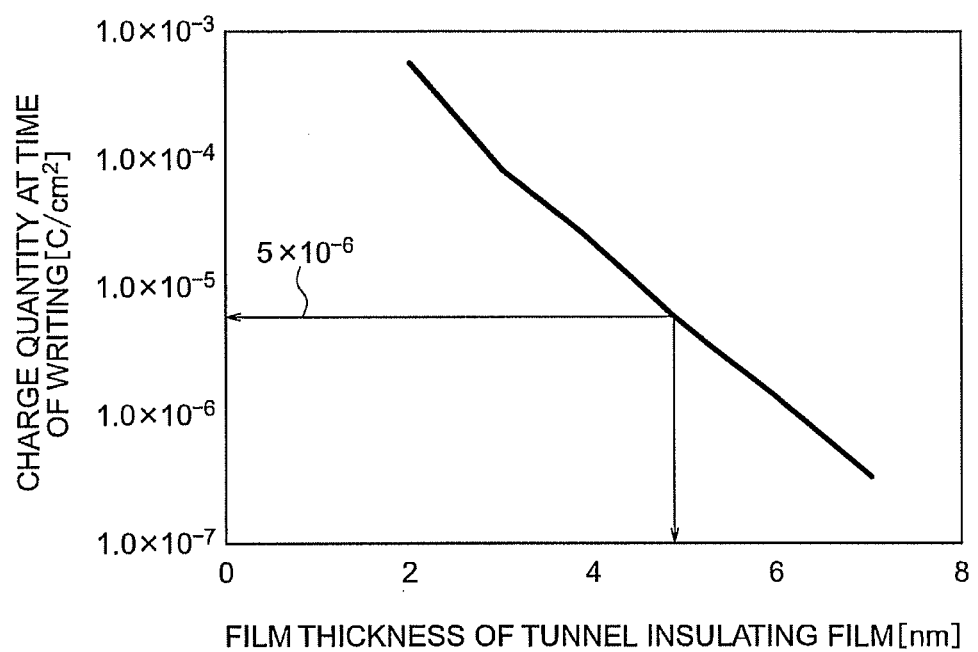
FIG. 8 is a graph showing the relationship between the charge quantity at the time of writing and the film thickness of the tunnel insulating film.

Here, $\epsilon_{ox}$ represents the permittivity of $SiO_2$, and $\Delta V_{th}$ represents the shift amount of the threshold voltage.

Where a stack structure formed with a silicon oxide film, a silicon nitride film (a SiN film), and an alumina (an $Al_2O_3$ film) is used as the stack structure formed with the tunnel insulating film, the charge trapping film, and the block insulating film in a typical MONOS structure, (EOT-z) in the equation (1) represents the electrical film thickness of the block insulating film, if a calculation is performed on the assumption that the charge center position of charges injected by a writing/erasing operation exists in the interface between the SiN film and the $Al_2O_3$ film, with reference to a known literature (S. Fujii, et al., SSDM2009). As is apparent from this, if $\Delta V_{th}$ needs to be 7 V, for example, $Q_{trap}$ needs to be $5 \times 10^{-6}$ $C/cm^2$. It is assumed that a writing operation is completed in a voltage application time of 100 μsec, for example. FIG. 8 shows the film thickness dependence of the quantity of charges that can be written in 100 μsec. Here, the calculation was performed, with the voltage applied to the control gate electrode 7 being 20V, the film thickness of the block insulating film 6 being 13 nm, and the film thickness of the charge trapping film 5 being 5 nm. As can be seen from FIG. 8, where the tunnel insulating film 3 is 5 nm or thicker, an injected charge quantity Q of $5 \times 10^{-6}$ $C/cm^2$ cannot be secured. Therefore, the film thickness of the tunnel insulating film 3 should preferably be smaller than 5 nm.

EXAMPLE

The following is a description of an example of this embodiment. In this example, a p-type Si layer is used as the semiconductor layer 1, a silicon oxide film is used as the tunnel insulating film 3, an $Al_2O_3$ film is used as the metal oxide film 4 for forming dipoles, and a $Si_3N_4$ film is used as the charge trapping film 5. It is apparent that the level of electrons trapped in the $Si_3N_4$ film 5 serving as the charge trapping film is located in a position that is 1.3 eV away from the Si conduction band. Also, there is a report that, when the $Al_2O_3$ film is inserted to the interface between the $SiO_2$ film and the $Si_3N_4$ film, dipoles are generated, and the band offset of the $SiO_2$ against electrons is lowered (see IEDM2007, Y. Kamimuta, et al., for example). Here, the amount of band modulation depends on the film thickness of the inserted $Al_2O_3$ film. Where the film thickness of the $Al_2O_3$ film is 0.2 nm, the amount of band modulation is 0.4 eV. Where the film thickness of the $Al_2O_3$ film is 0.5 nm, the amount of band modulation is 0.5 eV. Where the film thickness of the $Al_2O_3$ film is 1 nm, the amount of band modulation is 0.58 eV. Where the film thickness of the $Al_2O_3$ film is 1.5 nm or greater, the amount of band modulation is 0.6 eV.

Figure 9:
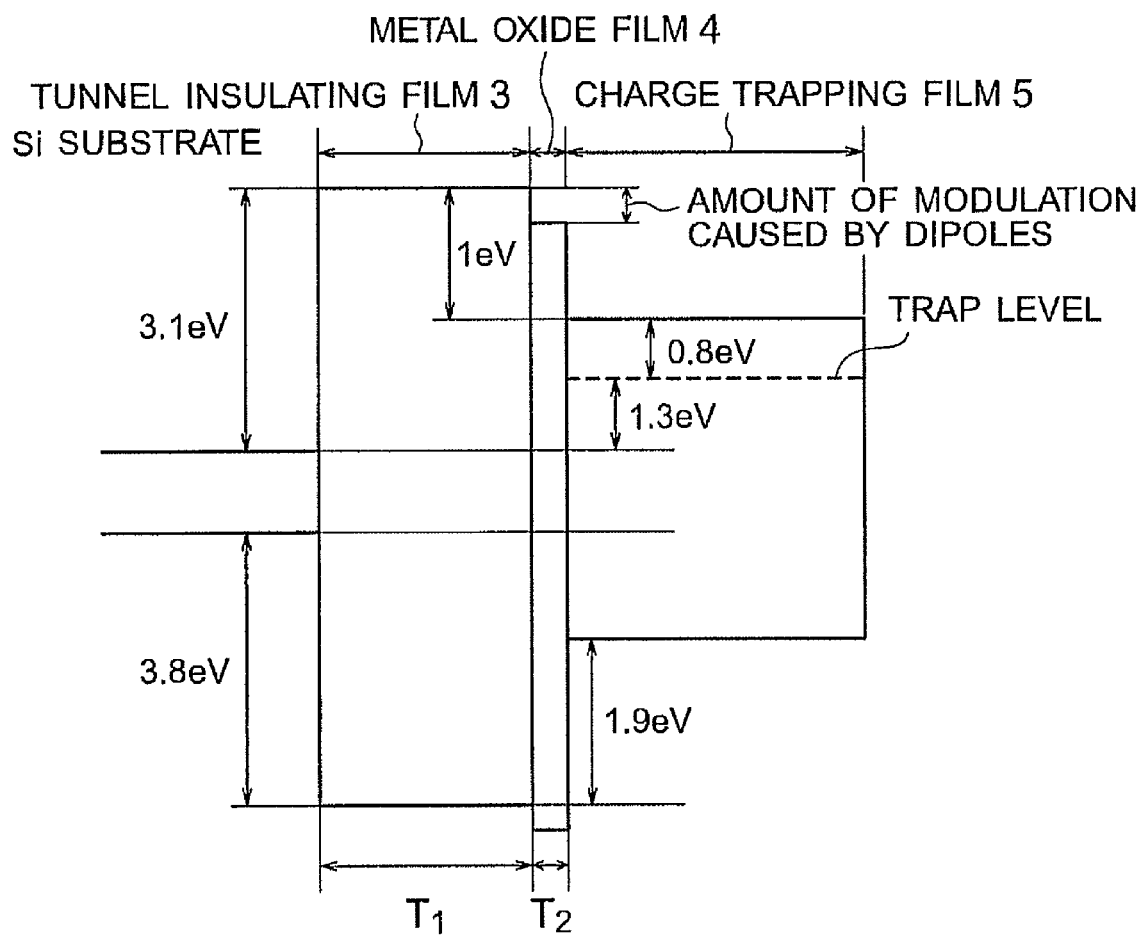
FIG. 9 is an energy band diagram in the first embodiment.

In this example, where the film thickness of the $Al_2O_3$ film is 1 mL (Molecular Layer) or smaller, or where the film thickness is smaller than the lattice constant of $Al_2O_3$ (=0.47 nm), the $Al_2O_3$ film 4 does not exist as a bulk, and only dipoles are formed in the interface between the $SiO_2$ film 3 and the $Si_3N_4$ film 5. Also, it is assumed that the band diagram obtained here is the same as the band diagram shown in FIG. 9, and that, where the film thickness of the $Al_2O_3$ film 4 is equal to or greater than the lattice constant, the $Al_2O_3$ film 4 has bulk properties. In view of this, a leakage current calculation was performed. Here, $T_1$ represents the film thickness of the tunnel insulating film 3, and $T_2$ represents the film thickness of the metal oxide film 4.

With the band structure being assumed to be the above described band structure, the leakage current flowing through the tunnel insulating film 3 is calculated, and the electron emission amount and the hole injection amount are determined. The leakage current was determined by performing calculations according to the following equations (2) and (3):

$$J = \frac{4\pi m e}{h^3} \int_0^\infty \varsigma(E_x) P^*(E_x) dE_x \qquad (2)$$

$$\varsigma(E_x) = \int_0^\infty \frac{dE_x}{1 + \exp[(E_r + E_x - E_F)/(k_B T)]} \qquad (3)$$

Here, e represents the elementary charges, m represents the mass of electrons in vacuum, h represents the Planck constant, $k_B$ represents the Boltzmann constant, and T represents the absolute temperature. Also, $E_x$ represents the energy in a position x in the electron tunneling direction, and is expressed as $E_x = E - E_r$, where E represents the energy retained by electrons. $E_F$ represents the Fermi level of the tunnel insulating film 3, and $P^*(E_x)$ represents the effective tunneling probability of the electrons flowing through the tunnel insulating film 3 in a case where an assist level does not exist.

Where $\epsilon_1$ and $\epsilon_2$ represent the permittivity of the tunnel insulating film 3 and the permittivity of the metal oxide film 4, respectively, and $V_1$ and $V_2$ represent the voltage to be applied to the tunnel insulating film 3 and the voltage to be applied to the metal oxide film 4, respectively, the actual electric fields $E_1$ and $E_2$ to be applied to the tunnel insulating film 3 and the metal oxide film 4 are expressed in:

$$\epsilon_{ox} E_{ox} = \epsilon_1 E_1 = \epsilon_2 E_2 \qquad (4)$$

Here, $\epsilon_{ox}$ (=3.9) represents the permittivity of $SiO_2$. It should be noted that the actual electric fields $E_1$ and $E_2$ are defined as:

$$E_1 = V_1/T_1, E_2 = V_2/T_2 \qquad (5)$$

Also, the effective tunneling probability $P^*(E_x)$ in the equation (2) is expressed as:

$$P^*(E_x) = P_{FN}(\phi_{b1}^*, m_1^*, E_1) P^{-1}_{FN}(\phi_{b1}^* - V_1, m_1^*, E_1) P_{FN}(\phi_{b2}^*, m_2^*, E_2) P^{-1}_{FN}(\phi_{b2}^* - V_2, m_2^*, E_2) \qquad (6)$$

Here, $\phi_{b1}^* = \phi_{b1} + E_F - E_x$, $\phi_{b2}^* = \phi_{b2} + E_F - E_x - V_1$, $m_1^*$, and $m_2^*$ represent the effective masses of tunneling electrons in the tunnel insulating film 3 and the metal oxide film 4 respectively. A typical effective mass is 0.5 m. Here, m represents the mass of electrons in vacuum. Also, $P_{FN}$ represents the Fowler-Nordheim (F-N) tunneling probability. Where $0 \leq E_x < \phi_b^*$ is satisfied, $P_{FN}$ is defined by the following equation (7):

$$P_{FN}(\phi_b^*, m^*, E) = \exp\left[-\frac{8\pi(2m^*)^{1/2}}{3heE}\phi_b^{*3/2}\right] \qquad (7)$$

Where $\phi_b^* \leq E_x$ is satisfied, $P_{FN}$ is defined by the following equation (8):

$$T_{FN}(\phi_b^*, m^*, E) = 1 \qquad (8)$$

Here, m* represents the effective mass of electrons tunneling through the tunnel insulating film 3, $\phi_b^*$ represents the effective barrier height of the tunnel insulating film 3, $E_F$ represents the Fermi level, $E_x$ represents the energy in the electron tunneling direction, e represents the elementary charges, h represents the Planck constant, and $E_1$ and $E_2$ represent the actual electric fields in the tunnel insulating film 3 and the metal oxide film 4, respectively. It should be noted that "F-N tunneling" means electrons tunneling through a tilted conduction band of an insulating film. A tunneling probability can be expressed by a combination of F-N tunneling probabilities as shown in the equation (5).

Figure 10:
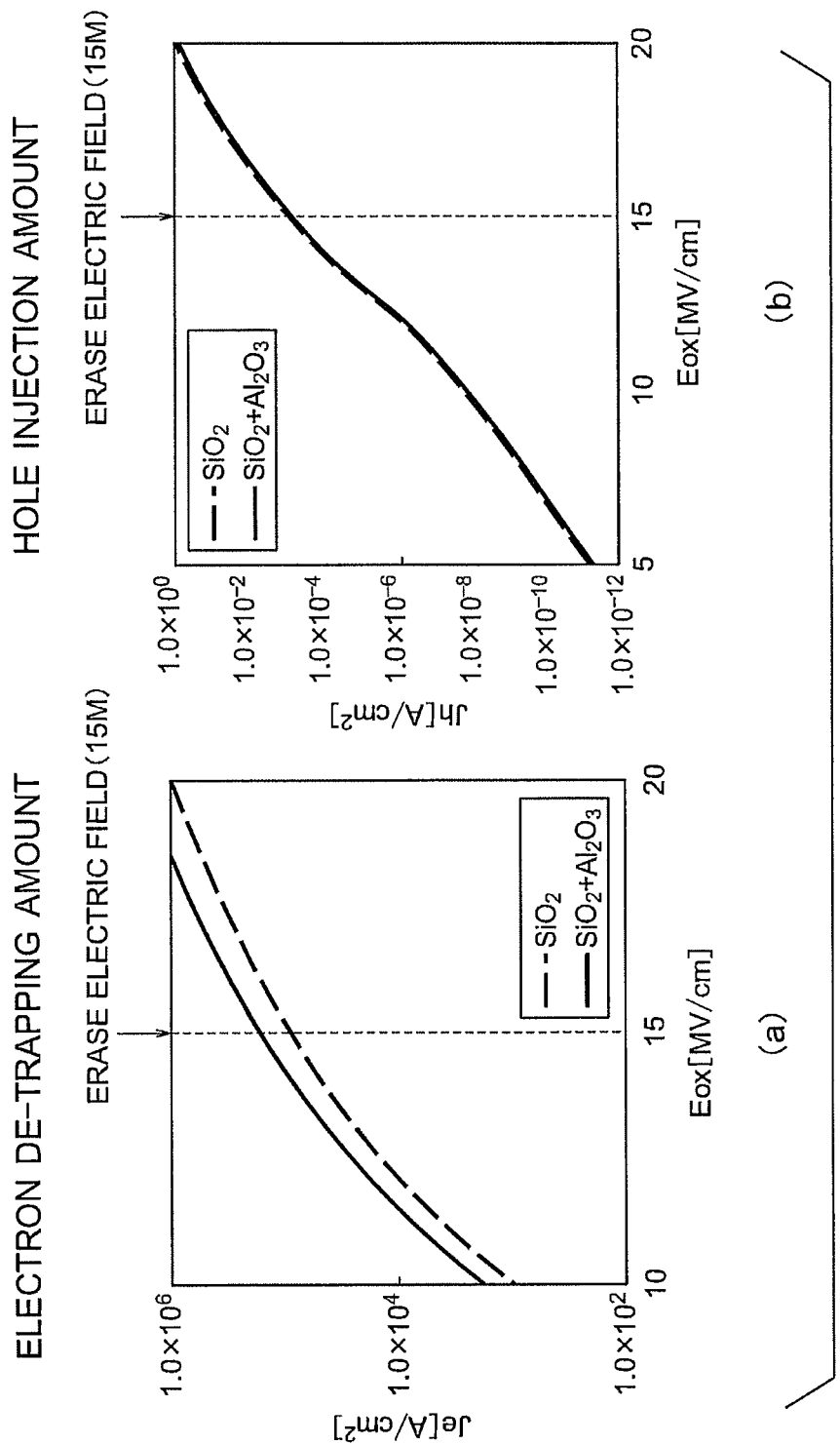
FIGS. 10(a) and 10(b) are graphs showing the electric field dependences of the de-trapped electron amount and injected hole amount in the tunnel insulating film of the first embodiment.
Figure 11:
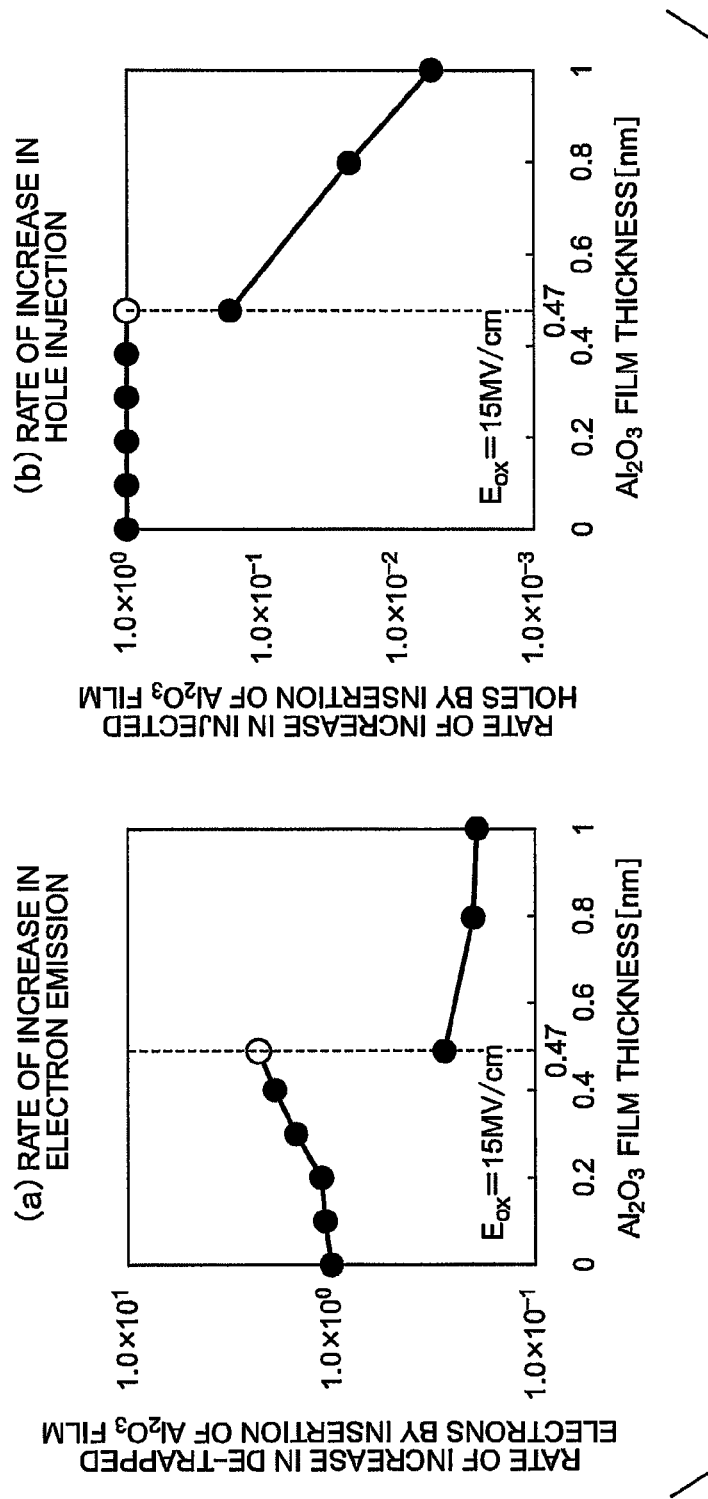
FIGS. 11(a) and 11(b) are graphs showing the metal-oxide-film thickness dependences of the rate of increase in electron emission and the rate of increase in hole injection in the first embodiment.

As an example, the oxide-film field dependences of the electron emission amount Je and the hole injection amount Jh were calculated where the film thickness of the tunnel insulating film 3 was 3 nm while the film thickness of the metal oxide film 4 was 0.4 nm. The results of those calculations are indicated by the solid lines in FIGS. 10(a) and 10(b). For comparison, the results obtained where the tunnel insulating film 3 was a single-layer film are indicated by the dashed lines. In the calculations, electrons and holes were regarded as free electrons and free holes, though, in reality, electrons de-trapped from the charge storage layer are trapped and held in the storage film. As can be seen from. FIGS. 10(a) and 10(b), with the erase electric field expressed as Eox=15 MV/cm, the amount of de-trapped electrons is larger than that in the case where the tunnel insulating film 3 is a single layer of a $SiO_2$ film, but the hole injection amount hardly varies. FIG. 11(a) shows the rate of increase in electrons de-trapped when the erase electric field (Eox=15 MV/cm) is applied in a case where the $Al_2O_3$ film is inserted as the metal oxide film 4, compared with the rate of increase in a case where the $Al_2O_3$ film is not inserted as the metal oxide film 4. FIG. 11(b) shows the rate of increase in injected holes. In FIGS. 11(a) and 11(b), the abscissa axis indicates the film thickness of the $Al_2O_3$ film, the black circles indicate the simulation results, and the white circles indicate the extrapolation points. As can be seen from those results, when the film thickness $T_{Al2O3}$ of the $Al_2O_3$ film as the metal oxide film 4 satisfies $0<T_{Al2O3}<0.47$ nm, electron de-trapping with the erase electric field is facilitated, but the hole injection amount does not vary. When the film thickness $T_{Al2O3}$ of the $Al_2O_3$ film satisfies $T_{Al2O3}$ 0.47 nm, the rate of increase in de-trapped electrons is lower than 1, and accordingly, it is apparent that electron de-trapping is restrained. That is, when the film thickness $T_{Al2O3}$ of the $Al_2O_3$ film as the metal oxide film 4 satisfies $0<T_{Al2O3}<0.47$ nm, the ratio of erasing by electron de-trapping to erasing by hole injection becomes higher in the case where the metal oxide film 4 is inserted. Therefore, to achieve the same erase characteristics, the hole injection amount can be reduced, and degradation of the tunnel insulating film 3 can be restrained. Here, the $Al_2O_3$ film 4 having a smaller film thickness than the lattice constant (0.47 nm) means that the area density of Al is less than $2.2\times10^{15}$ atoms/$cm^2$.

In a case where the charge trapping film 5 is a $Si_3N_4$ film, $HfO_2$, MgO, $TiO_2$, or $ZrO_2$ can be used as the metal oxide film 4, other than $Al_2O_3$. In a case where the charge trapping film 5 is a *hafnia* film (a $HfO_2$ film), a material that forms more dipoles than $HfO_2$ does, such as $Al_2O_3$, $TiO_2$, or $ZrO_2$ can be used as the metal oxide film 4. In that case, the upper limit of the film thickness of the metal oxide film 4 for restraining degradation of the tunnel insulating film 3 is determined from the lattice constant of each material. The lattice constant of $HfO_2$ is 0.51 nm, the lattice constant of MgO is 0.41 nm, the lattice constant of $TiO_2$ is 0.46 nm, and the lattice constant of $ZrO_2$ is 0.52 nm. Therefore, the upper limit of the film thickness of the metal oxide film 4 where $HfO_2$, MgO, $TiO_2$, or $ZrO_2$ is used as the material of the metal oxide film 4 is 0.51 nm, 0.41 nm, 0.46 nm, or 0.52 nm, respectively. The area density of Hf in the metal oxide film 4 or the interfacial region 4 is less than $1.3\times10^{15}$ atoms/$cm^2$. Likewise, the area density of Mg is less than $2.2\times10^{15}$ atoms/$cm^2$, the area density of Ti is less than $2.9\times10^{15}$ atoms/$cm^2$, and the area density of Zr is less than $1.5\times10^{15}$ atoms/$cm^2$.

It should be noted that the metal oxide film 4 can be deposited by ALD (Atomic Layer Deposition) or CVD (Chemical Vapor Deposition).

As described so far, according to this embodiment, erasing by de-trapping electrons is facilitated, and degradation of the tunnel insulating film due to write stress and erase stress can be restrained.

(Second Embodiment)

Figure 12:
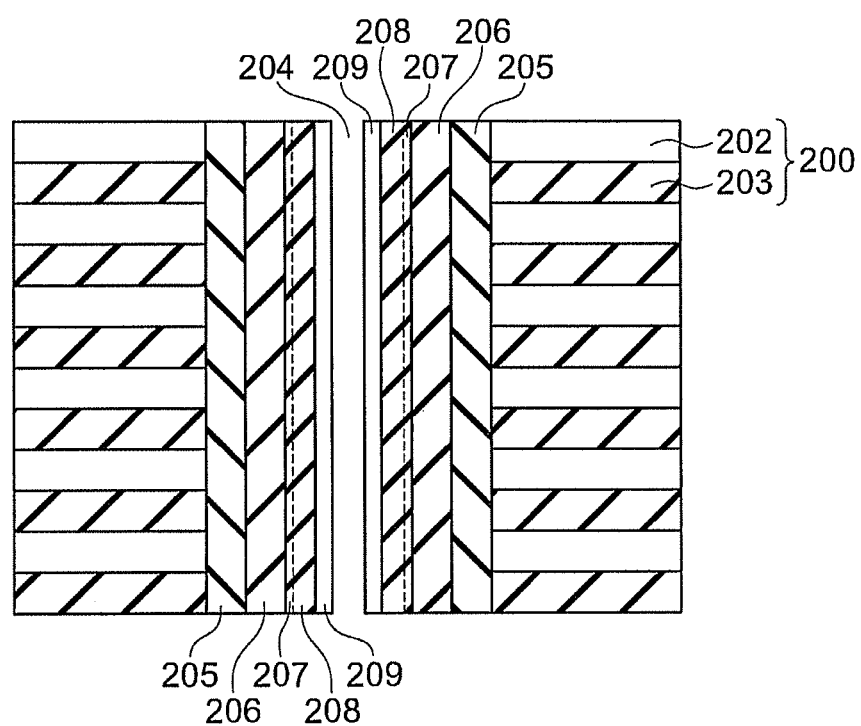
FIG. 12 is a cross-sectional view of a nonvolatile semiconductor memory apparatus according to a second embodiment.

FIG. 12 shows a nonvolatile semiconductor memory apparatus according to a second embodiment. The nonvolatile semiconductor memory apparatus of this embodiment is a MONOS semiconductor memory that has a stack structure formed by stacking control gates made of doped polysilicon or the like and interlayer insulating films formed with silicon oxide films or the like. The nonvolatile semiconductor memory apparatus includes memory cells.

The nonvolatile semiconductor memory apparatus of this embodiment has a stack structure 200 formed by stacking control gates 202 made of doped polysilicon or the like and interlayer insulating films 203 formed with silicon oxide films or the like on a substrate (not shown) (FIG. 12). The stack structure 200 has an opening 204 formed to extend in the stacking direction. A block insulating film 205 that is formed with a high-permittivity insulating film or a silicon oxide film is formed on the inner wall of the opening 204. A silicon nitride film to be a charge trapping film 206 is formed to cover the inner surface (located on the opposite side from the stack structure 200) of the block insulating film 205 formed along the inner wall of the opening 204. A metal oxide film 207 such as an $Al_2O_3$ film is formed to cover the inner surface (located on the opposite side from the block insulating film 205) of the silicon nitride film 206. A tunnel insulating film 208 is formed to cover the inner surface (located on the opposite side from the silicon nitride film 206) of the metal oxide film 207. As in the first embodiment, the metal oxide film 207 is very thin, and is formed in a region (an interfacial region) of the interface between the tunnel insulating film 208 and the charge trapping film 206, with the region being located on the side of the tunnel insulating film 208. The interfacial region 207 contains metal atoms, and the metal atoms bind to the oxygen in the tunnel insulating film 208. Accordingly, the metal oxide film 207 is included in the tunnel insulating film 208. It should be noted that the tunnel insulating film 208 can be a single layer of a silicon oxide film or a single layer of a silicon oxynitride film. In a case where the tunnel insulating film 208 is a single layer of a silicon oxynitride film, however, the nitrogen concentration distribution can extend in the film thickness direction, and a region that does not contain nitrogen can exist in the interface with a later described semiconductor layer 209 or in the interface with the charge trapping film 206. The semiconductor layer 209 to be a channel is formed to cover the inner surface (located on the opposite side from the metal oxide film 207) of the tunnel insulating film 208. The metal oxide film 207 is made of a material that forms dipoles in the direction from the charge trapping film 206 to the tunnel insulating film 208, or a material that has positive charges on the side of the charge trapping film 206 and has negative charges on the side of the tunnel insulating film 208. For example, a material selected from the group consisting of $Al_2O_3$, $HfO_2$, $ZrO_2$, $TiO_2$, and MgO is used as the metal oxide film 207. In other words, the metal oxide film 207 contains an element selected from the group consisting of Al, Hf, Zr, Ti, and Mg. The film thickness of the metal oxide film 207 is preferably greater than 0 and is preferably smaller than the lattice constant of the material forming the metal oxide film 207, as in the first embodiment.

The nonvolatile semiconductor memory apparatus of this embodiment having the above described structure is a semiconductor memory apparatus having a three-dimensional structure. This semiconductor memory apparatus has the metal oxide film 207 interposed between the tunnel insulating film 208 and the charge trapping film 206, as in the first embodiment. Accordingly, dipoles are generated in the interface between the tunnel insulating film 208 and the metal oxide film 207. Thus, erasing by electron emission is facilitated, and degradation of the tunnel insulating film 208 can be restrained, as in the first embodiment.

In the first and second embodiments, the film thickness of the metal oxide film 4 (207) is greater than 0 and is smaller than the lattice constant of the material forming the metal oxide film 4 (207). That is, the metal oxide film 4 (207) is an interfacial region 4 (207) of the interface between the tunnel insulating film 3 (208) and the charge trapping film 5 (206), with the interfacial region 4 (207) being located on the side of the tunnel insulating film 3 (208). The interfacial region 4 (207) contains metal atoms, and the metal atoms bind to the oxygen in the tunnel insulating film 3 (208), to form dipoles. Specifically, atoms of at least one metal selected from the group consisting of Al, Hf, Zr, Ti, and Mg exist in the interface between the tunnel insulating film 3 (208) and the charge trapping film 5 (206), and the metal atoms can diffuse into the charge trapping film 5 (206).

In this embodiment, a nonvolatile semiconductor memory apparatus having a three-dimensional structure has been described. However, this embodiment can also be applied a fin-type nonvolatile semiconductor memory apparatus, a nanowire-type nonvolatile semiconductor memory apparatus, the nonvolatile semiconductor memory apparatus disclosed in JP-A 2007-266143(KOKAI), and the three-dimensionally stacked nonvolatile semiconductor memory apparatus disclosed by R. Katsumata, et al., in 2009 VLSI symp., p. 136.

As described so far, according to each of the above embodiments, degradation of the tunnel insulating film due to write stress and erase stress can be restrained.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A nonvolatile semiconductor memory apparatus comprising:
    a semiconductor layer;
    a first insulating film provided on the semiconductor layer, the first insulating film being a single-layer film containing silicon oxide or silicon oxynitride;
    a charge trapping film provided on the first insulating film;
    a second insulating film provided on the charge trapping film; and
    a control gate electrode provided on the second insulating film,
    wherein a metal oxide exists in an interface between the first insulating film and the charge trapping film, the metal oxide is one of $Al_2O_3$, $HfO_2$, $ZrO_2$, $TiO_2$, and MgO, and the charge trapping film includes an element different from elements included in the metal oxide,
    wherein a thickness of the metal oxide is less than 0.47 nm when the metal oxide is $Al_2O_3$
    wherein a thickness of the metal oxide is less than 0.51 nm when the metal oxide is $HfO_2$,
    wherein a thickness of the metal oxide is less than 0.41 nm when the metal oxide is MgO,
    wherein a thickness of the metal oxide is less than 0.46 nm when the metal oxide is $TiO_2$, and
    wherein a thickness of the metal oxide is less than 0.52 nm when the metal oxide is $ZrO_2$.

2. The apparatus according to claim 1, wherein
    an area density of metal atoms of the metal oxide in an interfacial region of the first insulating film is less than $1.3 \times 10^{15}$ atoms/cm$^2$ when a metal of the metal atoms is Hf,
    an area density of the metal atoms in a region of the interface is less than $2.2 \times 10^{15}$ atoms/cm$^2$ when the metal is Mg,
    an area density of the metal atoms in a region of the interface is less than $2.9 \times 10^{15}$ atoms/cm$^2$ when the metal is Ti, or
    an area density of the metal atoms in a region of the interface is less than $1.5 \times 10^{15}$ atoms/cm$^2$ when the metal is Zr.

3. The apparatus according to claim 1, wherein the first insulating film is a silicon oxide film, and a film thickness of the first insulating film is 1.8 nm or greater and is smaller than 5 nm.

4. The apparatus according to claim 1, wherein the first insulating film is a silicon oxynitride film, and a nitrogen concentration included in the silicon oxynitride film is less than 20 atomic %.

5. The apparatus according to claim 1, wherein the charge trapping film is a silicon nitride film.

6. The apparatus according to claim 1, wherein the charge trapping film is a *hafnia* film, and the charge trapping film comprises at least Al, Zr, or Ti.

7. A nonvolatile semiconductor memory apparatus comprising:
    a stack structure stacking a control gate and an interlayer insulating film alternately, and having an opening provided to extend in a stacking direction of the stack structure;
    a first insulating film provided along an inner wall of the opening;
    a charge trapping film provided to cover an inner surface of the first insulating film, the inner surface of the first insulating film being located on the opposite side from the stack structure;
    a second insulating film provided to cover an inner surface of the charge trapping film, the inner surface of the charge trapping film being located on the opposite side from the first insulating film; and
    a semiconductor layer provided to cover an inner surface of the second insulating film, the inner surface of the second insulating film being located on the opposite side from the charge trapping film,
    wherein a metal oxide exists in an interface between the second insulating film and the charge trapping film, the metal oxide is one of $Al_2O_3$, $HfO_2$, $ZrO_2$, $TiO_2$, and MgO, and the charge trapping film includes an element different from elements included in the metal oxide,
    wherein a thickness of the metal oxide is less than 0.47 nm when the metal oxide is $Al_2O_3$
    wherein a thickness of the metal oxide is less than 0.51 nm when the metal oxide is $HfO_2$,
    wherein a thickness of the metal oxide is less than 0.41 nm when the metal oxide is MgO,
    wherein a thickness of the metal oxide is less than 0.46 nm when the metal oxide is $TiO_2$, and
    wherein a thickness of the metal oxide is less than 0.52 nm when the metal oxide is $ZrO_2$.

8. The apparatus according to claim 7, wherein
    an area density of metal atoms of the metal oxide in an interfacial region of the second insulating film is less than $1.3 \times 10^{15}$ atoms/cm$^2$ when a metal of the metal atoms is Hf,
    an area density of the metal atoms in a region of the interface is less than $2.2 \times 10^{15}$ atoms/cm$^2$ when the metal is Mg,
    an area density of the metal atoms in a region of the interface is less than $2.9 \times 10^{15}$ atoms/cm$^2$ when the metal is Ti, or
    an area density of the metal atoms in a region of the interface is less than $1.5 \times 10^{15}$ atoms/cm$^2$ when the metal is Zr.

9. The apparatus according to claim 7, wherein the second insulating film is a silicon oxide film, and a film thickness of the second insulating film is 1.8 nm or greater and is smaller than 5 nm.

10. The apparatus according to claim 7, wherein the second insulating film is a silicon oxynitride film, and a nitrogen concentration included in the silicon oxynitride film is less than 20 atomic %.

11. The apparatus according to claim 7, wherein the charge trapping film is a silicon nitride film.

12. The apparatus according to claim 7, wherein the charge trapping film is a *hafnia* film, and the charge trapping film comprises at least Al, Zr, or Ti.

* * * * *